(12) United States Patent
Ahrens et al.

(10) Patent No.: US 8,436,707 B2
(45) Date of Patent: May 7, 2013

(54) SYSTEM AND METHOD FOR INTEGRATED INDUCTOR

(75) Inventors: Carsten Ahrens, Pettendorf (DE); Gunther Mackh, Neumarkt (DE); Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 12/686,164

(22) Filed: Jan. 12, 2010

(65) Prior Publication Data

US 2011/0169596 A1 Jul. 14, 2011

(51) Int. Cl.
*H01F 27/02* (2006.01)

(52) U.S. Cl.
USPC .......................................................... 336/83

(58) Field of Classification Search .................. 336/200, 336/232, 83, 206–208, 233–234; 257/531
See application file for complete search history.

(56) References Cited

U.S. PATENT DOCUMENTS

| | | | |
|---|---|---|---|
| 2,465,276 A | 2/1948 | Ryder | |
| 5,539,241 A * | 7/1996 | Abidi et al. | 257/531 |
| 5,547,599 A | 8/1996 | Wolfrey et al. | |
| 5,821,846 A | 10/1998 | Leigh et al. | |
| 6,013,030 A | 1/2000 | Webler et al. | |
| 6,114,937 A * | 9/2000 | Burghartz et al. | |
| 6,191,468 B1 | 2/2001 | Forbes et al. | |
| 6,287,931 B1 | 9/2001 | Chen | |
| 6,338,900 B1 | 1/2002 | Tada et al. | |
| 6,417,039 B2 | 7/2002 | Webster | |
| 6,480,086 B1 * | 11/2002 | Kluge et al. | 336/200 |
| 6,643,913 B2 | 11/2003 | Uchikoba et al. | |
| 6,817,085 B2 | 11/2004 | Uchikoba et al. | |
| 7,061,359 B2 | 6/2006 | Ding et al. | |
| 7,187,263 B2 * | 3/2007 | Vinciarelli | 336/200 |
| 7,208,345 B2 | 4/2007 | Meyer et al. | |
| 7,262,680 B2 * | 8/2007 | Wang | 336/200 |
| 7,271,693 B2 | 9/2007 | Ding et al. | |
| 7,463,131 B1 | 12/2008 | Hwang et al. | |
| 7,852,185 B2 * | 12/2010 | Gardner et al. | 336/200 |
| 2007/0298520 A1 | 12/2007 | Renaud et al. | |
| 2008/0054398 A1 * | 3/2008 | Lin et al. | 257/531 |
| 2009/0140383 A1 * | 6/2009 | Chang et al. | 257/531 |
| 2010/0127345 A1 * | 5/2010 | Sanders et al. | 257/528 |
| 2011/0084765 A1 * | 4/2011 | Kim et al. | 330/277 |

FOREIGN PATENT DOCUMENTS

JP 3019358 1/1991

* cited by examiner

*Primary Examiner* — Tuyen Nguyen
(74) *Attorney, Agent, or Firm* — Slater & Matsil, L.L.P.

(57) ABSTRACT

In one embodiment, an inductor has a substrate, a conductor disposed above the substrate and a seamless ferromagnetic material surrounding at least a first portion of the conductor.

29 Claims, 14 Drawing Sheets

US 8,436,707 B2

SYSTEM AND METHOD FOR INTEGRATED INDUCTOR

TECHNICAL FIELD

This invention relates generally to electrical components, and more particularly to a system and method for an integrated inductor.

BACKGROUND

In current electronic applications, discrete inductors, such as ferrite bead inductors, are often used to protect conductor lines against electromagnetic interference (EMI). These EMI filter ferrite bead inductors provide a resistance at high frequency that dissipates high frequency energy in the form of heat. Another application of ferrite inductors is output voltage smoothing for DC/DC-converter. Here, the ferrite inductor acts as a device with a high capability to store energy.

In both cases, ferrite inductors are widely used together with capacitors in order to provide efficient low pass characteristics. To date, ferrite inductors are manufactured as discrete SMD-devices in standard rectangular two terminal packages. For example, inductors are available in 0402 packages with a dimension corresponding to 1.0 mm by 0.5 mm. With mobile units like cellular phones and MP3-players becoming continuously smaller and requiring more power conversion functionality, the cost and size required for discrete inductors is becoming a limiting factor for further miniaturization.

Conventional discrete inductors are manufactured using a layered approach. A ferrite layer is provided on which a conductor is deposited, typically by printing. A second ferrite layer is deposited on the inductor and everything is baked together to enable a continuous magnetic flow in ferrite material. If more than one conductive layer is used, for example, to provide higher inductances, additional conductive and ferrite layers are stacked on one another and vias are provided to interconnect the conductive layers. The layered ferrite approach, however, is limited in the case of higher integration with other passive or active devices.

SUMMARY OF THE INVENTION

In one embodiment, an inductor has a substrate, a conductor disposed above the substrate and a seamless ferromagnetic material surrounding at least a first portion of the conductor.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely systems and methods for an integrated inductor. Embodiments of this invention may also be applied to systems and methods directed toward other magnetic circuits.

In embodiments of the present invention, a conductor is deposited on a substrate, a portion of the substrate material is etched away and a magnetic material is filled around portions of the conductor and within a portion of the void etched from the substrate. In embodiments, magnetic material with a large cross-section is formed. In further embodiments, other electronic components, such as capacitors and active circuitry is included on the substrate.

Figure 1:
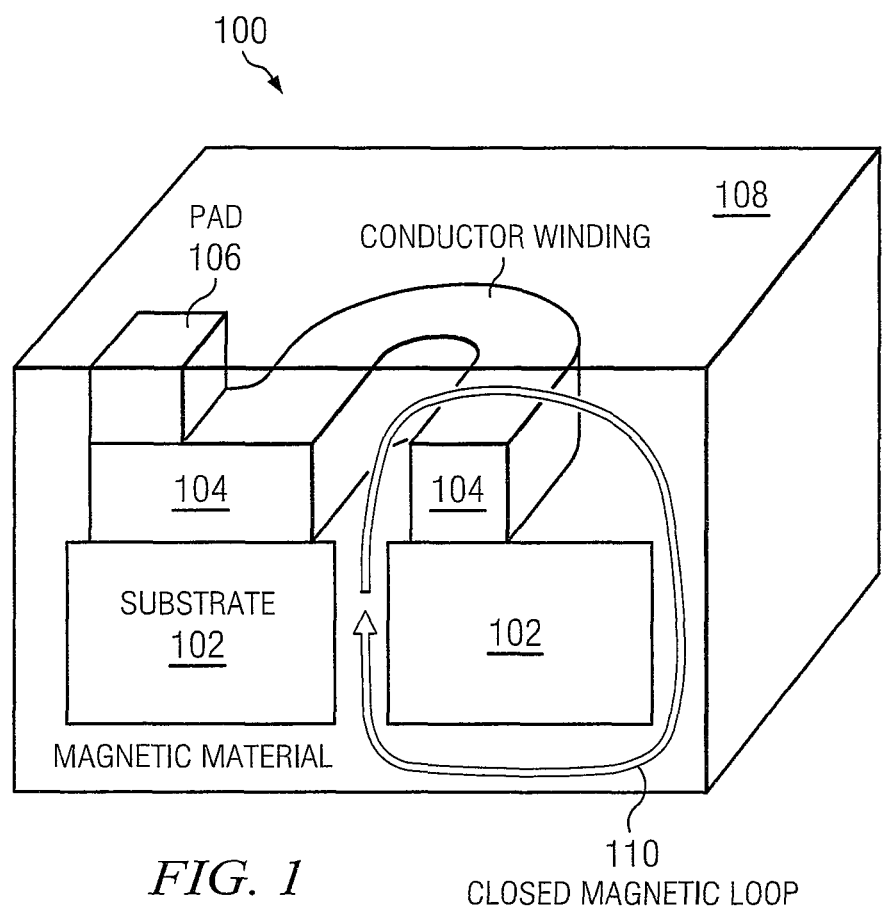
FIG. 1 illustrates an embodiment inductor.

FIG. 1 illustrates an inductor 100 according to an embodiment of the present invention. Inductor 100 is made of conductor winding 104 on top of substrate 102. Magnetic material 108 surrounds conductor winding 104 to provide closed magnetic loop 110. Pad 106 is provided to create an electrical connection to conductor winding 104.

In an embodiment, conductor line 104 is a planar spiral inductor on top of an isolated substrate 102. Alternatively, conductor line 104 can form a loop, one or more windings, a spiral geometry with a flat or high aspect ratio profile, a coil in two or more planes, a solenoid, a simple line, or other geometry. The material for conductor line 104 can include copper, aluminum, silver, gold, any of the above mentioned materials with small portion of added other elements, or other conductive materials in embodiments of the present invention. Alternatively, conductor line can be made from other materials available in a semiconductor process such as highly doped polysilicon, for example. Embodiment materials for substrate 102 include, but are not limited to, semiconductor substrates, isolator material, ceramic substrates, metal pad, composite material, polymer substrates, or stacks made of layers of the before mentioned materials.

In an embodiment method of producing inductor 100, conductive line 104 is first provided on substrate 102. Conductive line 104 is provided by using a physical vapor deposition (PVD) process followed by patterning and etching. Alternatively, PVD followed by lift-off, plating, printing, or other techniques known in the art can be used. Conductive line 104 is isolated and passivated after being deposited on substrate 102. In alternative embodiments conductor 104 is left non-insolated. Pad 106 is then provided at the inductor terminals with conductive surface material for assembly. In some embodiments, pad 106 has a bondable or solderable surface for later assembly using bondwires, direct bonding, solder joints or other forms of assembly. In other embodiments, pads 106 have a solderable surface adapted for under bump metallization for later application of solder areas such as solder balls. Alternatively pad 106 can have a solder material, A material-free loop is provided by removing substrate material in and below the core of conductor line 104 and outside the inductor area. In an embodiment, this is realized by etching a hole into substrate 102 from the top side to a certain depth, and then thinning the substrate from the backside until the before etched hole is reached. Alternatively, the a cavern can be etched into substrate 102 beneath without forming a complete hole. The geometry of the cavity can completely envelop or partially envelop conductor 104. In embodiments, substrate 102 can be etched by using techniques known in the art such as dry etching, wet etching, selective etching, local etching with lithography mask, sawing using mechanical methods, laser etching, or other forms of etching.

In an embodiment, magnetic material 108 is applied by molding with mold material that contains ferrite particles (magnetic mold) and a mold tool that forms a cavity and defines the later outside dimensions. After removal from a mold tool inductor 100 is fully enclosed in magnetic mold with pads 106 extending to the surface. Alternatively, the magnetic fill material can be a magnetic polymer, magnetic paste, a material using magnetic micro- or nanoparticles, or other magnetic material. In embodiments of the present invention, the fill processes can be an injection, compression, or transfer process that uses a tool to form a cavity to limit the mold dimensions, for example. Alternatively, magnetic material 108 can be applied by printing, spray, spin-on, or combinations of different methods. Because magnetic material 108 is applied in the same process step, magnetic material 108 is a seamless magnetic material having a low magnetic resistance in some embodiments. Sequential multistep-processes for frontside and backside application of magnetic material 108, however, can also be used. After magnetic material 108 is applied to inductor 100, subsequent treatment, such as annealing and/or magnetic field can be performed in some embodiments in order to apply the desired magnetic properties of magnetic material 108.

After magnetic material 108 is applied to conductor 104, subsequent process steps including pad connection, passivation, thinning and separation and backside are performed in embodiments of the present invention. Pad connection includes opening the pads through the magnetic layer or through a protection layer, as well as finalization of pads 106 with protective layers, barrier layers, solderable layers or solder in some embodiments. Backside processes include, but are not limited to providing die attach material, metal connections, and isolation. Passivation is performed using techniques known in the art to protect inductor 100 against humidity, contamination, or mechanical impact and other environmental factors. In some embodiments, a subset of the subsequent process steps are performed depending on the application and its specifications. Alternatively, subsequent process can be omitted.

Figure 2A:
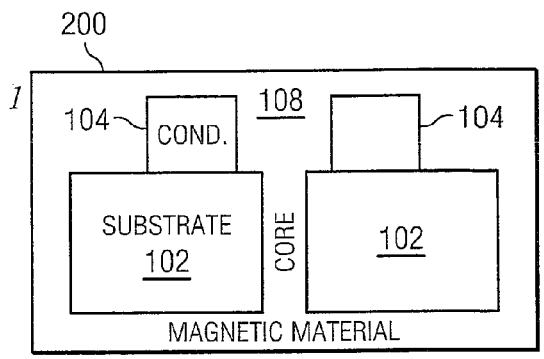
FIGS. 2a-2g illustrate cross-sectional diagrams of embodiment inductors.

FIGS. 2a to 2g illustrate cross-sections of different embodiment inductors. FIG. 2a illustrates embodiment inductor 200 having conductor 104 on top of a substrate 102, where the magnetic loop is closed by locally removing substrate material in areas beside conductor line 104. These regions, and the areas below and above the substrate are filled with magnetic material 108.

Figure 2B:
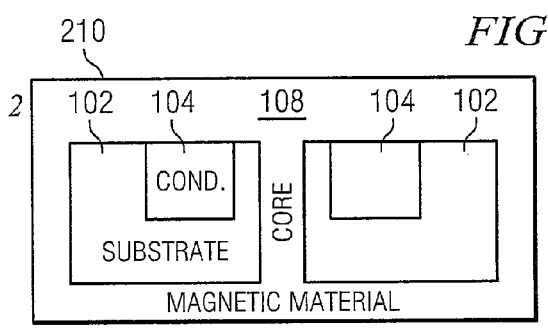

FIG. 2b illustrates embodiment inductor 210 having conductor 104 within substrate 102, where the magnetic loop is closed by locally removing substrate material in areas beside conductor line 104. These regions and the areas below and above the substrate are filled with magnetic material 108.

Figure 2C:
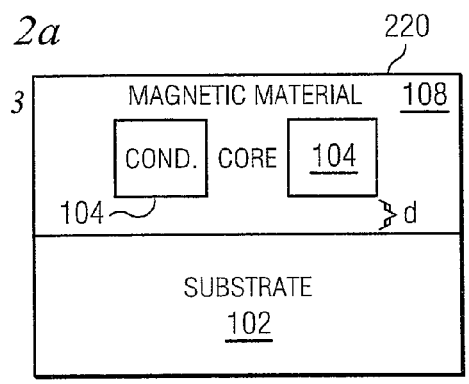

FIG. 2c illustrates embodiment inductor 220 having conductor 104 a distance d over substrate 102. In embodiments, distance d is between about 0.5 μm and about 50 μm. Alternatively, other distances outside of this range can be used depending on the application and its specifications. In this embodiment, substrate 102 is first coated by a dummy layer on which conductor 104 is formed. In succeeding steps the dummy layer is removed, thereby leaving conductor 104 in place, and magnetic material 108 is applied to fill the area around conductor 104 to provide a complete magnetic loop around conductor 104. The dummy layer can be applied by any deposition method like spin-on, spray, printing, lamination, CVD or PVD and its material can contain at least portions from the group of polymers, aerogels, carbon, silicon dioxide or doped silicon dioxide.

Figure 2D:
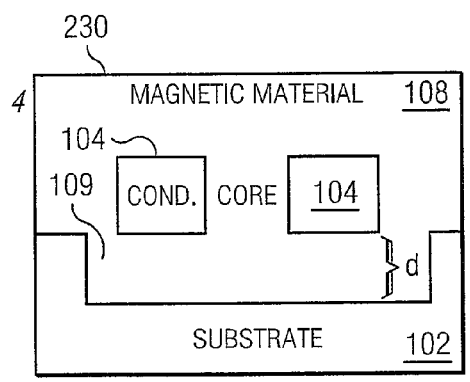

FIG. 2d illustrates embodiment inductor 230 having conductor 104 above substrate 102 at a distance d above the bottom of cavity 109. During processing, cavity 109 is etched into substrate 102 below conductor 104 overlapping the conductor area. Magnetic material 108 is filled into cavity 109 and around conductor 104 to form a closed magnetic loop. In an alternative embodiment, substrate cavity 109 can extend all the way through substrate 102.

Figure 2E:
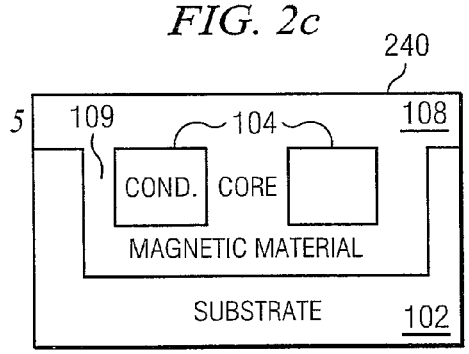

FIG. 2e illustrates embodiment inductor 240 having conductor 104 above substrate 102 at a distance d above the bottom of cavity 109. During processing, conductor 104 is fabricated within substrate 102 using techniques known in the art. Next, cavity 109 is etched into substrate 102 below and around conductor 104. Magnetic material 108 is filled into cavity 109 and around conductor 104 to form a closed magnetic loop. In an alternative embodiment, substrate cavity 109 can extend all the way through substrate 102.

Figure 2F:
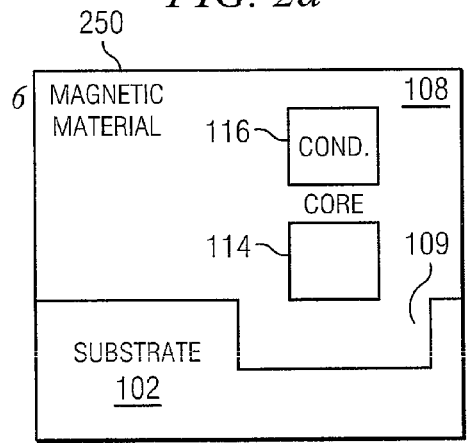

FIG. 2f illustrates embodiment inductor 250 having two conductive layers 114 and 116. Bottom conductor 114 is above substrate 102 at a distance d above the bottom of cavity 109, and top conductor 116 is a distance e above the top surface of bottom conductor 114. In embodiments, distance e is between about 0.2 µm and about 20 µm, however, in alternative embodiments distances outside of this range can be used depending on the application and its specifications. During processing, material between bottom and top conductors 114 and 116 is etched away, and cavity 109 is etched into substrate 102 below bottom conductor 114. Magnetic material 108 is then filled into cavity 109 and around and between conductors 114 and 116 to form a closed magnetic loop. In an alternative embodiment, substrate cavity 109 can extend all the way through substrate 102. In an alternative embodiment of the present invention, substrate cavity 109 is not etched. In a further embodiment, substrate 102 is omitted and the multilayer structure is realized by a sequence of magnetic mold applications and conductor lines.

Figure 2G:
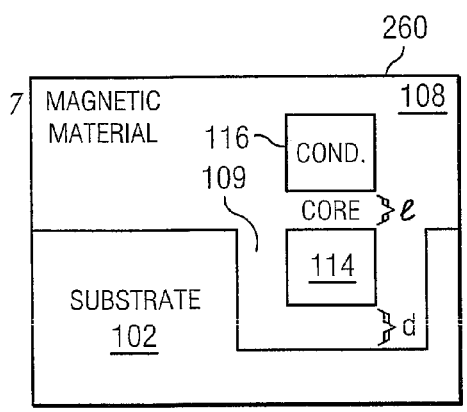

FIG. 2g illustrates embodiment inductor 260 having two layers of conductors 114 and 116. Bottom conductor 114, which is fabricated within substrate 102 prior to substrate etching, is above substrate 102 at a distance d above the bottom of cavity 109, and top conductor 116 is a distance e above the top surface of bottom conductor 114. During processing, material between bottom and top conductor lines 114 and 116 is etched away. Cavity 109 is etched into substrate 102 below bottom conductor line 114. Magnetic material 108 is then filled into cavity 109 and around and between conductors 114 and 116 to form a closed magnetic loop. In an alternative embodiment, substrate cavity 109 can extend all the way through substrate 102. In an alternative embodiment of the present invention, substrate cavity 109 is not etched. In a further embodiment, substrate 102 is omitted and the multilayer structure is realized by a sequence of magnetic mold applications and conductor lines.

Figure 3A:
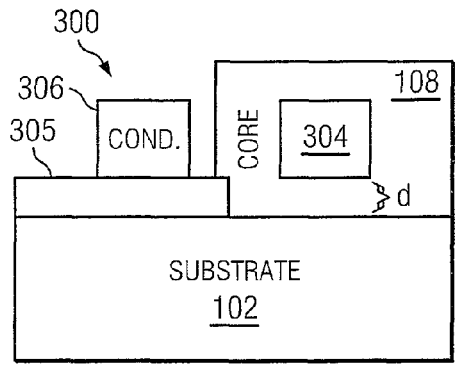
FIGS. 3a-3g illustrate cross-sectional diagrams of embodiment inductors having partial magnetic fill.

FIGS. 3a to 3g illustrate cross-sections of different embodiment inductors in which magnetic material is partially filled. FIG. 3a illustrates embodiment inductor 300 having a portion 304 of the conductive line at a distance d above substrate 102, and another portion 306 of the conductive line supported by dummy layer 305. Processing is similar to the embodiment of FIG. 2c, however, a portion of dummy layer 305 is not etched away under conductor portion 306, and magnetic material 108 is filled over and around conductor portion 304, but not over conductor portion 306. Embodiment dummy layer 305 provides support for the conductor, as well as providing stability for the overall structure. Embodiments that use a partially molded approach provide cost savings, especially in cases where high cost magnetic materials and/or high cost magnetic material processes are used, since less magnetic material is needed to fabricate the part.

Figure 3B:
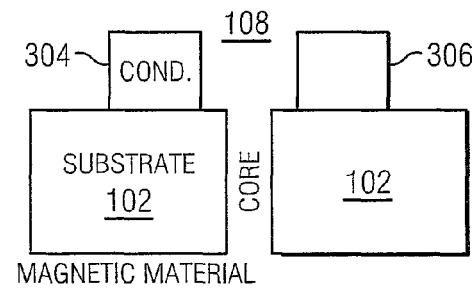

FIG. 3b illustrates embodiment inductor 310 having conductor portions 306 and 304 on substrate 102. Processing is similar to the embodiment shown in FIG. 2a, however, magnetic material 108 is partially filled so that it surrounds conductor portion 304 and not conductor portion 306.

Figure 3C:
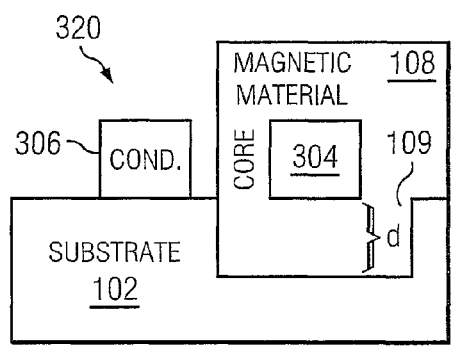

FIG. 3c illustrates embodiment inductor 320 having conductor portion 306 on substrate 102, and conductor portion 304 a distance d above the bottom of cavity 109, which is etched in substrate 102 under conductor portion 304 and not under conductor portion 306. Magnetic material 108 is partially filled so that it surrounds conductor portion 304 and not conductor portion 306. By having conductor portion 306 on substrate 102, the resulting structure is more stable.

Figure 3D:
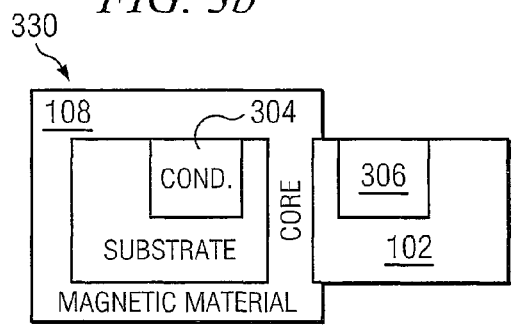

FIG. 3d illustrates embodiment inductor 330 having conductor portions 306 and 304 in substrate 102. Processing is similar to the embodiment shown in FIG. 2b, however, magnetic material 108 is partially filled so that it surrounds conductor portion 304 and not conductor portion 306.

Figure 3E:
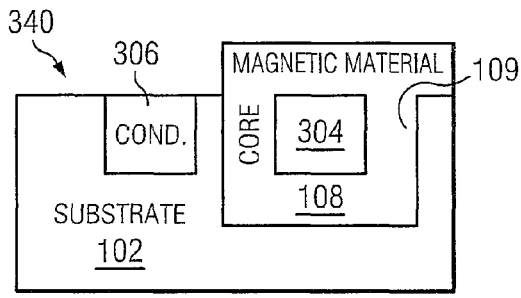

FIG. 3e illustrates embodiment inductor 340 having conductor portion 306 in substrate 102, and conductor portion 304 a distance d above the bottom of cavity 109, which is etched in substrate 102 under conductor portion 304 and not under conductor portion 306. Magnetic material 108 is partially filled so that it surrounds conductor portion 304 and not conductor portion 306. By having conductor portion 306 in substrate 102, the resulting structure is more stable.

Figure 3F:
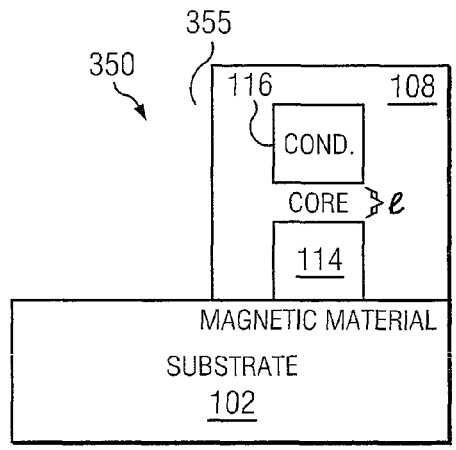

FIG. 3f illustrates embodiment inductor 350 having two layers of conductors 114 and 116. Bottom conductor 114 is on substrate 102, and top conductor 116 is a distance e above the top surface of bottom conductor 114. During processing, material between bottom and top conductor lines 114 and 116 is etched away. Magnetic material 108 is then filled around and between conductors 114 and 116 to form a closed magnetic loop, but portion 355 above substrate 102 remains uncovered by magnetic material.

Figure 3G:
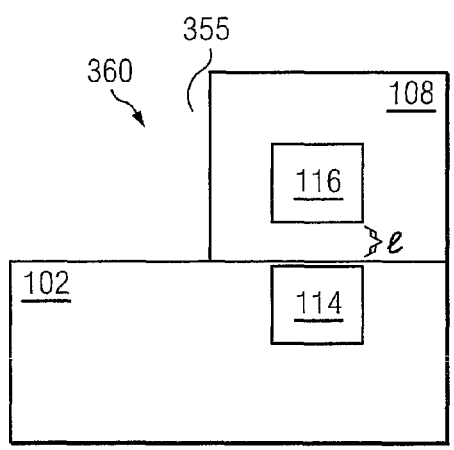

FIG. 3g illustrates embodiment inductor 360 having two layers of conductors 114 and 116. Bottom conductor 114 is in substrate 102, and top conductor 116 is a distance e above the top surface of bottom conductor 114 and substrate 102. During processing, material between bottom and top conductor lines 114 and 116 is etched away. Magnetic material 108 is then filled around and between conductors 114 and 116 to form a closed magnetic loop, but portion 355 above substrate 102 remains uncovered by magnetic material.

In an embodiment of the present invention, the area and/or geometric distribution of the magnetic material can be adjusted during the application of the magnetic material to trim or to adjust the inductance of the resultant inductor. For example, a higher inductance can be achieved if a larger percentage of the conductor is surrounded by the magnetic material. Likewise, a lower inductance can be achieved by surrounding a lower percentage of the conductor with magnetic material.

Figure 4A:
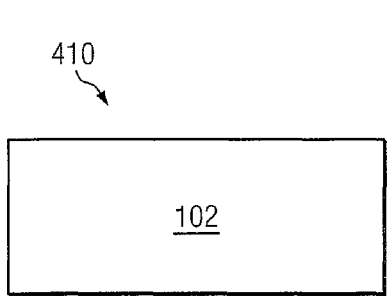
FIGS. 4a-4e illustrate cross-sectional diagrams and a plan view diagram showing the fabrication of an embodiment inductor.
Figure 4B:
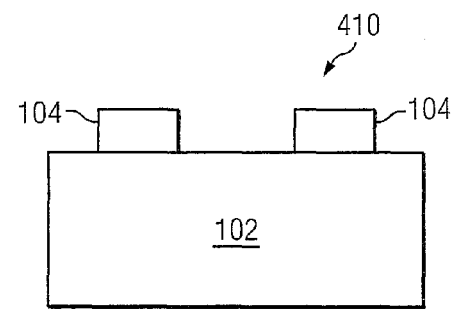
Figure 4C:
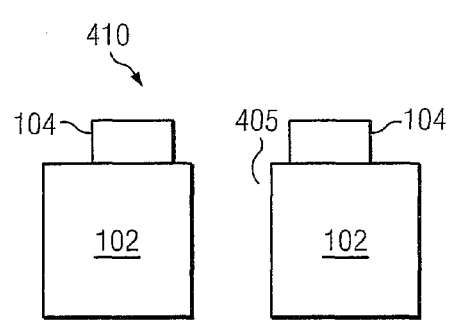
Figure 4D:
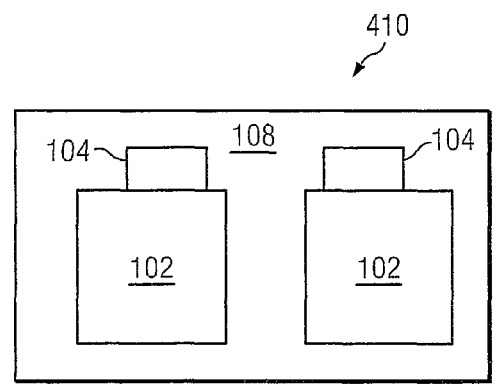

FIGS. 4a-4e illustrate cross-sectional diagrams and a plan view diagram showing fabrication of an embodiment inductor 410 of the present invention. FIG. 4a illustrates a cross sectional diagram of substrate 102. Conductor 104 is deposited on substrate 102 and patterned as shown in FIG. 4b. Void 405 is etched though substrate 102 as shown in FIG. 4c, and magnetic material 108 is deposited as illustrated in FIG. 4d. Alternatively, void 405 is created by etching a first portion of substrate 102 from the top side of substrate 102, and etching or grinding a second portion of substrate 102 from the bottom side of the substrate 102. In alternative embodiments, other techniques known in the art can be used to create void 405 in substrate 102.

Figure 4E:
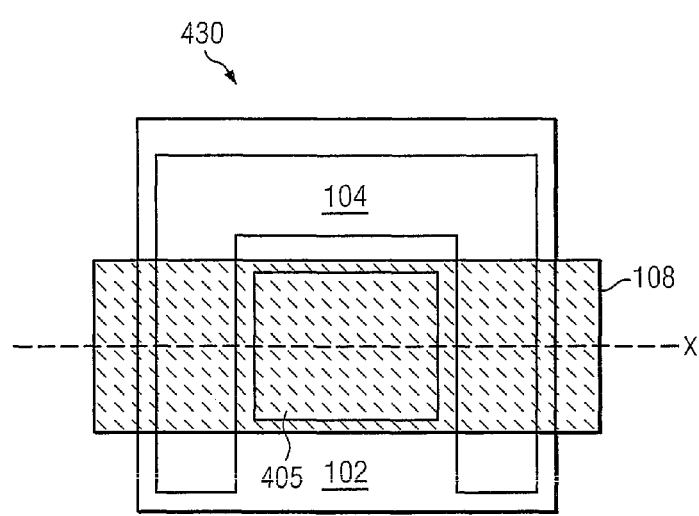

FIG. 4e illustrates a plan view of inductor 410, where line x represents the location at which the cross-sectional diagrams of FIGS. 4a-4d were taken. In an embodiment, conductor 104 forms a "U" shape region around void 405, however, in alternative embodiments, the shape of the conductor can differ. As shown, magnetic material 108 is deposited on at least a portion of conductor 104 In alternative embodiments of the present invention, the size and shape of void 405, as well as the amount and geometrical distribution of magnetic material 108 can differ.

Figure 5A:
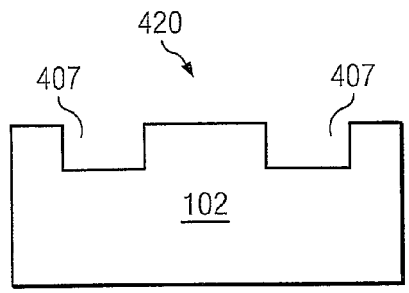
FIGS. 5a-5e illustrate cross-sectional diagrams and a plan view diagram showing the fabrication of an another embodiment inductor.
Figure 5B:
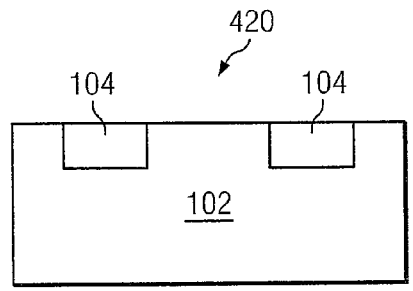
Figure 5C:
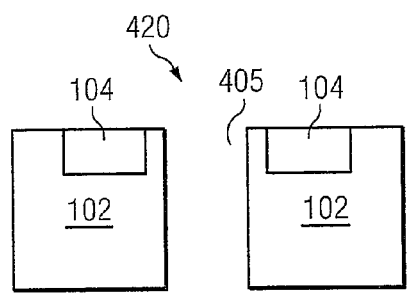
Figure 5D:
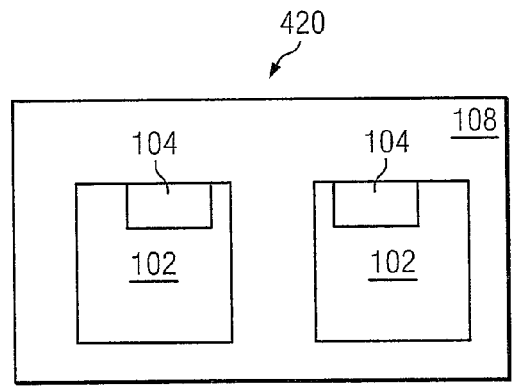

FIGS. 5a-5e illustrate cross-sectional diagrams and a plan view diagram showing fabrication of an embodiment inductor 420. FIG. 5a illustrates a cross sectional diagram of substrate 102 after cavities 407 have been etched into substrate 102 using techniques known in the art. Conductor 104 is deposited in cavities 407 in substrate 102 as shown in FIG. 5b. Void 405 is etched though substrate 102 as shown in FIG. 5c, and magnetic material 108 is deposited as illustrated in FIG. 5*d*. Alternatively, void 405 is created by etching a first portion of substrate 102 from the top side of substrate 102, and etching or grinding a second portion of substrate 102 from the bottom side of the substrate 102. In alternative embodiments, other techniques known in the art can be used to create void 405 in substrate 102.

Figure 5E:
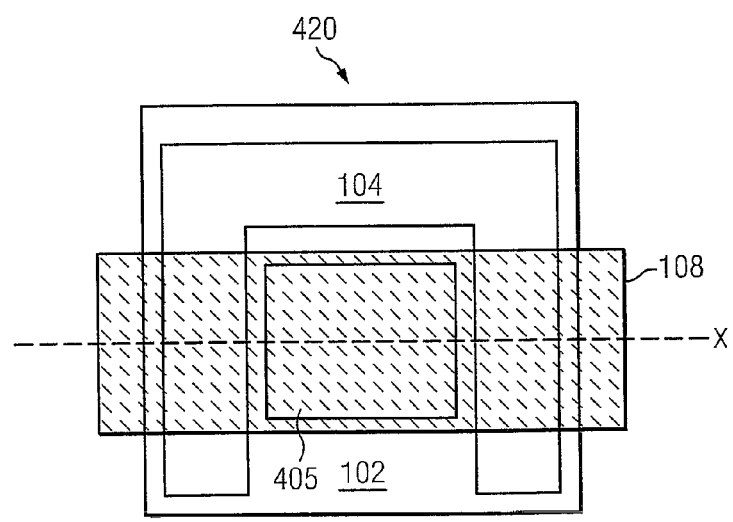

FIG. 5*e* illustrates a plan view of inductor 420, where line x represents the location at which the cross-sectional diagrams of FIGS. 5*a*-5*d* were taken. In an embodiment, conductor 104 forms a "U" shape around void 405, however, in alternative embodiments, the shape of the conductor can differ. As shown, magnetic material 108 is deposited on at least a portion of the substrate 102 and conductor 104. In alternative embodiments of the present invention, the size and shape of void 405, as well as the amount and geometrical distribution of magnetic material 108 can differ.

Figure 6A:
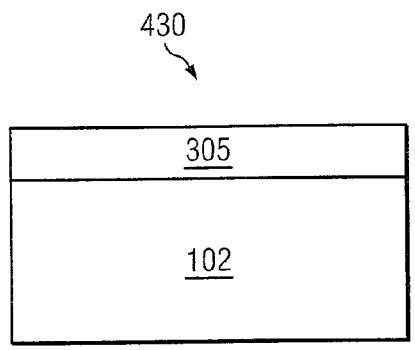
FIGS. 6a-6e illustrate cross-sectional diagrams and a plan view diagram showing the fabrication of an another embodiment inductor.
Figure 6B:
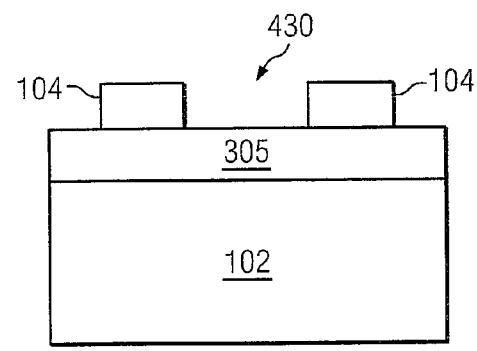
Figure 6C:
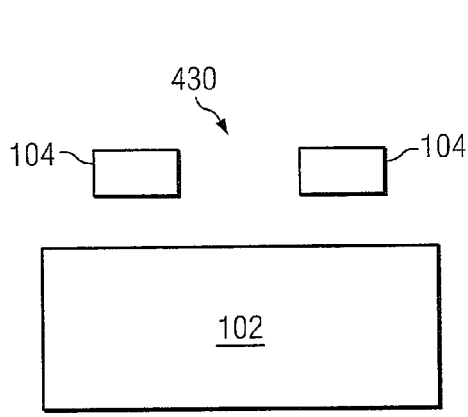
Figure 6D:
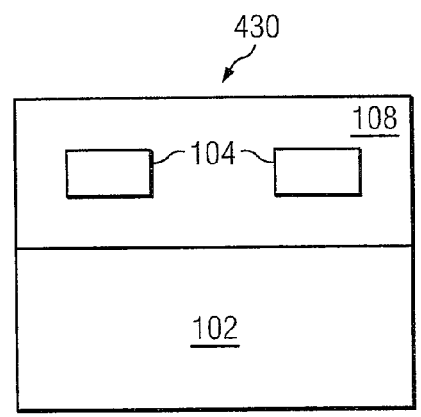
Figure 6E:
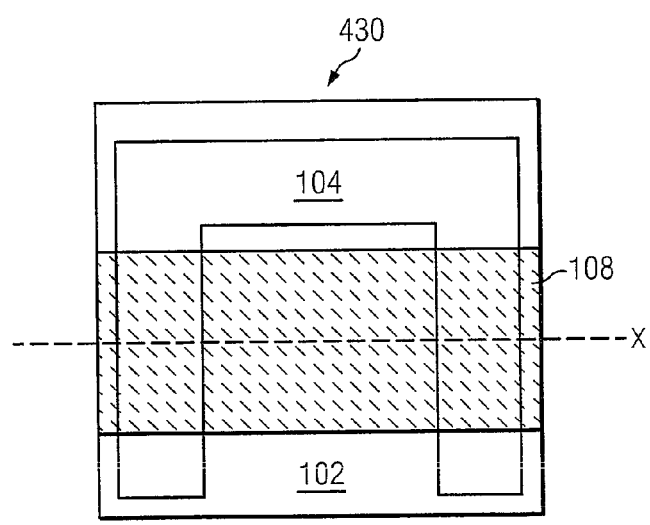

FIGS. 6*a*-6*e* illustrate cross-sectional diagrams and a plan view diagram showing fabrication of an embodiment inductor 430. FIG. 5*a* illustrates a cross sectional diagram of substrate 102 after dummy layer 305 is disposed over substrate 102. Conductor 104 is deposited and patterned over dummy layer 305 as shown in FIG. 6*b*. Dummy later 305, is then etched away as shown in FIG. 6*c*, and magnetic material 108 is deposited as illustrated in FIG. 6*d*. FIG. 6*e* illustrates a plan view of inductor 430, where line x represents the location at which the cross-sectional diagrams of FIGS. 6*a*-6*d* were taken. In an embodiment, conductor 104 forms a "U" shape, however, in alternative embodiments, the shape of the conductor can differ. As shown, magnetic material 108 is deposited on at least a portion of the substrate 102 and conductor 104. In alternative embodiments of the present invention, the amount and geometrical distribution of magnetic material 108 can differ.

Figure 7A:
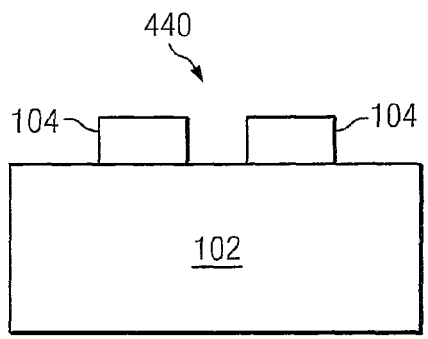
FIGS. 7a-7d illustrate cross-sectional diagrams and a plan view diagram showing the fabrication of an another embodiment inductor.
Figure 7B:
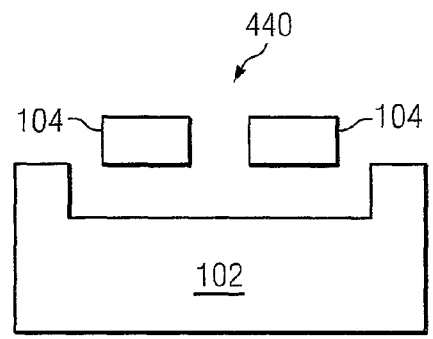
Figure 7C:
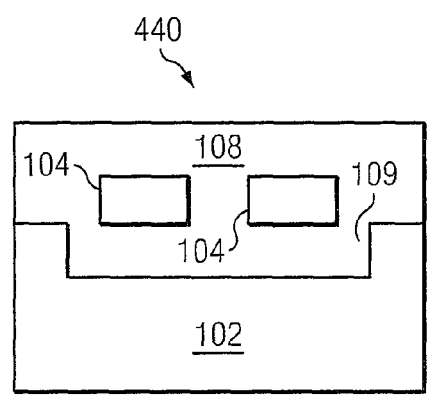
Figure 7D:
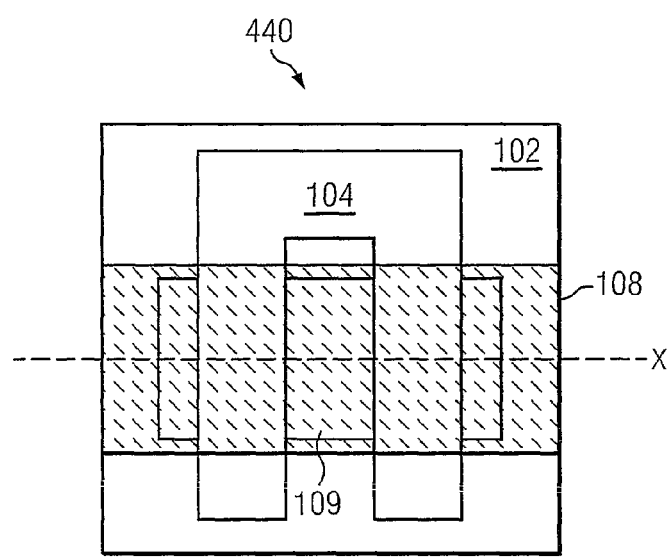

FIGS. 7*a*-7*d* illustrate cross-sectional diagrams and a plan view diagram showing fabrication of an embodiment inductor 440. FIG. 7*a* illustrates a cross-sectional diagram of substrate 102 after conductor 104 has been deposited and patterned according to techniques known in the art. Cavity 109 is etched from substrate 102 underneath a portion of conductor 104, as shown in FIG. 7*b*. Magnetic material 108 is deposited as illustrated in FIG. 7*c*. FIG. 7*d* illustrates a plan view of inductor 440, where line x represents the location at which the cross-sectional diagrams of FIGS. 7*a*-7*c* were taken. In an embodiment, conductor 104 forms a "U" shape, however, in alternative embodiments, the shape of conductor 104 can differ. As shown, magnetic material 108 is deposited to surround a portion conductor 104, and cavity 109. In alternative embodiments of the present invention, the size and shape of cavity 109, as well as the amount and geometrical distribution of magnetic material 108 can differ.

Figure 8A:
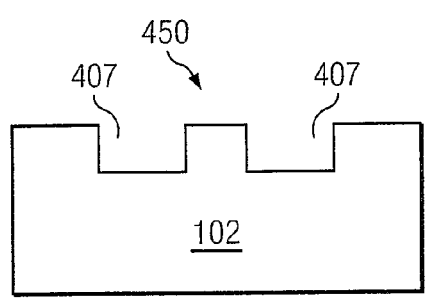
FIGS. 8a-8e illustrate cross-sectional diagrams and a plan view diagram showing the fabrication of an another embodiment inductor.
Figure 8B:
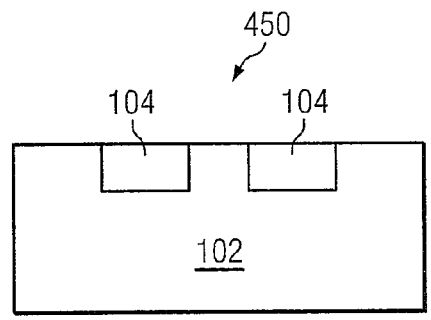
Figure 8C:
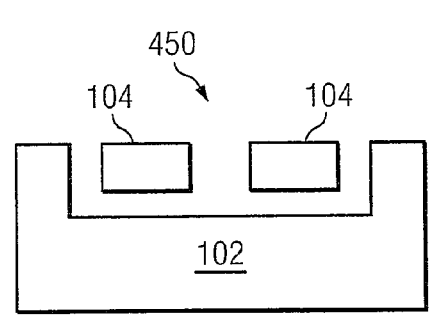
Figure 8D:
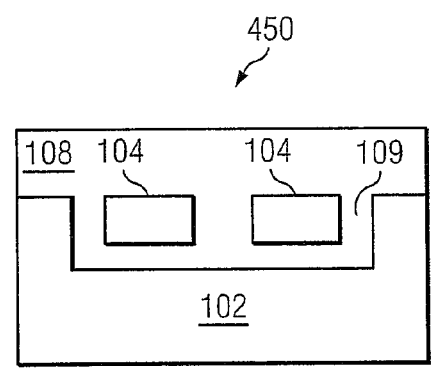
Figure 8E:
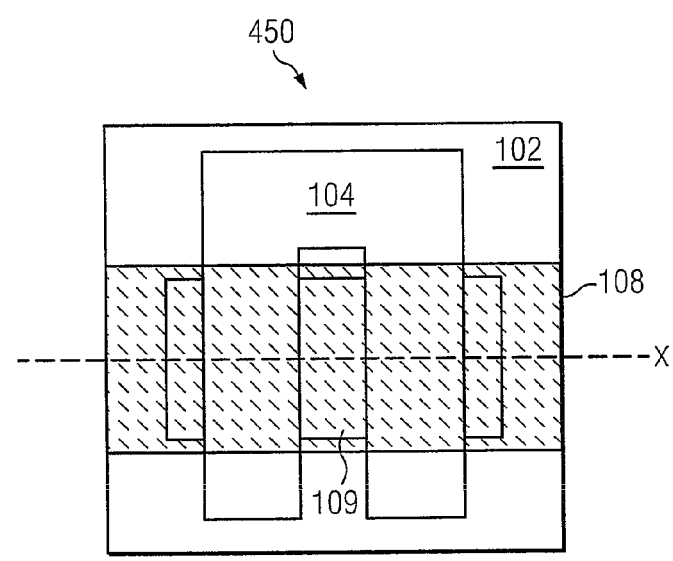

FIGS. 8*a*-8*e* illustrate cross-sectional diagrams and a plan view diagram showing fabrication of an embodiment inductor 450 of the present invention. FIG. 8*a* illustrates a cross sectional diagram of substrate 102 after cavities 407 have been etched into substrate 102 using techniques known in the art. Conductor 104 is then deposited in cavities 407, as shown in FIG. 8*b*. Cavity 109 is etched from substrate 102 underneath a portion of conductor 104, as shown in FIG. 8*c*, and magnetic material 108 is deposited as illustrated in FIG. 8*d*. FIG. 8*e* illustrates a plan view of inductor 450, where line x represents the location at which the cross-sectional diagrams of FIGS. 8*a*-8*d* were taken. In an embodiment, conductor 104 forms a "U" shape, however, in alternative embodiments, the shape of the conductor can differ. As shown, magnetic material 108 is deposited around conductor 104. In alternative embodiments of the present invention, the size and shape of cavity 109, as well as the amount and geometrical distribution of magnetic material 108 can differ.

Figure 9A:
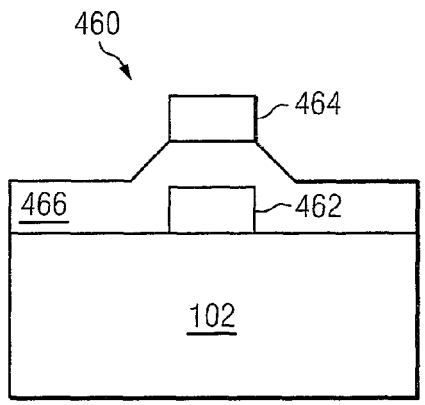
FIGS. 9a-9f illustrate cross-sectional diagrams and a plan view diagram showing the fabrication of an another embodiment inductor.
Figure 9B:
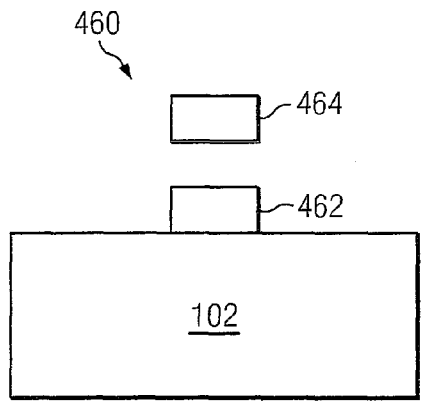
Figure 9C:
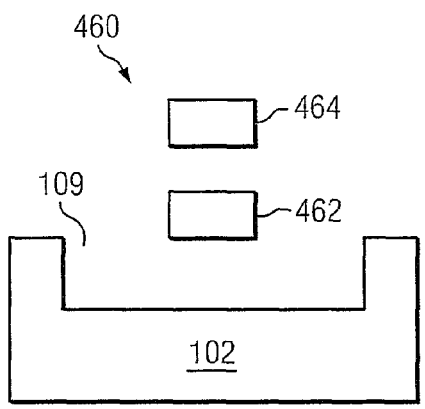
Figure 9D:
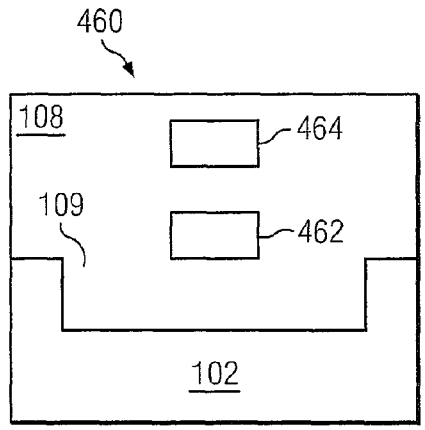

FIGS. 9*a*-9*f* illustrate cross-sectional diagrams and a plan view diagram showing fabrication of an embodiment inductor 460 of the present invention. FIG. 9*a* illustrates a cross sectional diagram of substrate 102 after conductive layer 462 is deposited on substrate 102, dummy layer 466 is deposited on conductive layer 462, and conductive layer 464 is deposited on dummy layer 466. In an embodiment, dummy layer 466 is an oxide, however, other materials can be used. Conductive layers 462 and 464, and dummy layer 466 are patterned and etched according to techniques known in the art. Next, dummy layer 466 is etched leaving a gap as shown in FIG. 9*b*, and cavity 109 is etched from substrate 102 from under conductive line 462 as shown in FIG. 9*c*. Magnetic material 108 is deposited conductive lines 462 and 464 and within cavity 109 as illustrated in FIG. 9*d*.

Figure 9E:
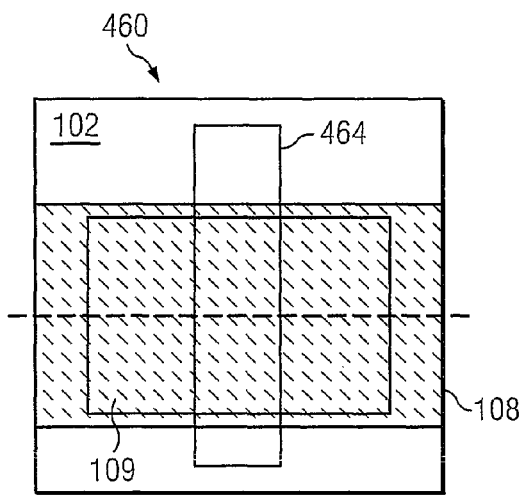
Figure 9F:
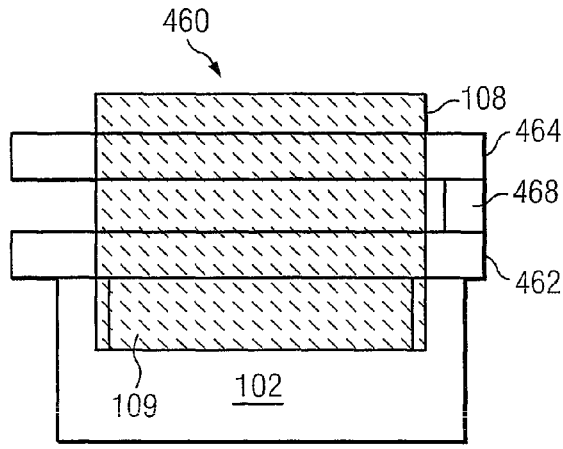

FIG. 9*e* illustrates a plan view of inductor 460, where line x represents the location at which the cross-sectional diagrams of FIGS. 9*a*-9*d* were taken. In an embodiment, conductor 464 forms a simple line, however, in alternative embodiments, the shape of the conductor can differ. In alternative embodiments of the present invention, the size and shape of cavity 109, as well as the amount and geometrical distribution of magnetic material 108 can differ. FIG. 9*f* illustrates a side cross sectional view of inductor 460 showing via 468, which couples bottom conductor 462 to top conductor 464.

Figure 10A:
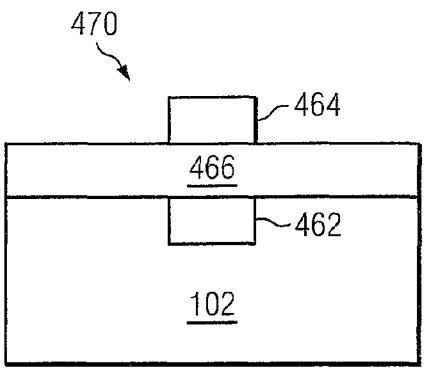
FIGS. 10a-10e illustrate cross-sectional diagrams and a plan view diagram showing the fabrication of a further embodiment inductor.
Figure 10B:
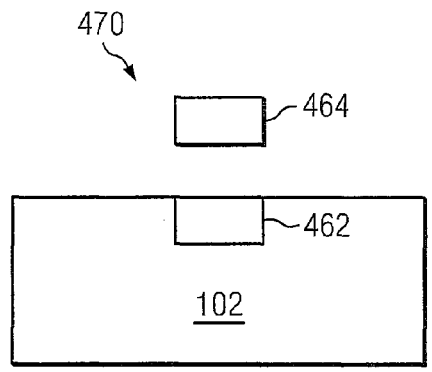
Figure 10C:
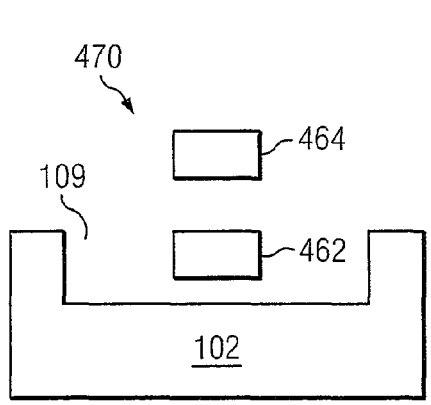
Figure 10D:
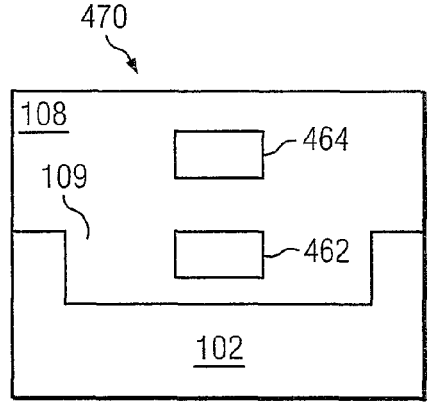

FIGS. 10*a*-10*e* illustrate cross-sectional diagrams and a plan view diagram showing fabrication of an embodiment inductor 470. FIG. 10*a* illustrates a cross sectional diagram of substrate 102 after conductive layer 462 is deposited in substrate 102, dummy layer 466 is deposited on conductive layer 462 (and substrate 102), and conductive layer 464 is deposited on dummy layer 466. Conductive layer 464, and dummy layer 466 are patterned and etched according to techniques known in the art. Next, dummy layer 466 is etched leaving a gap between conductive layers 462 and 464 as shown in FIG. 10*b*. Cavity 109 is etched from substrate 102 from under and around conductive line 462 as shown in FIG. 10*c*. Magnetic material 108 is then deposited around conductive lines 462 and 464 and within cavity 109 as illustrated in FIG. 10*d*.

Figure 10E:
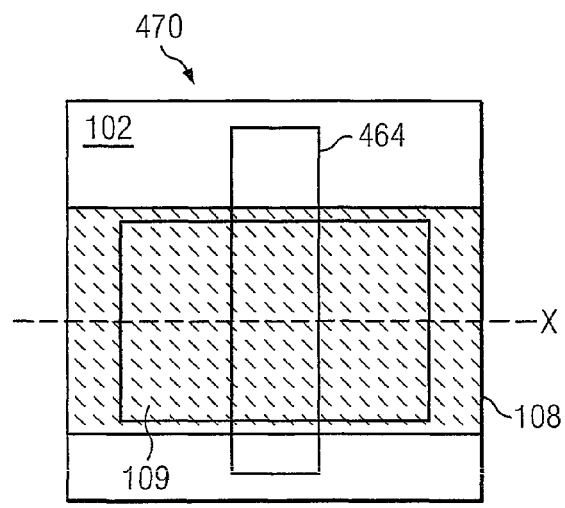

FIG. 10*e* illustrates a plan view of inductor 470, where line x represents the location at which the cross-sectional diagrams of FIGS. 10*a*-10*d* were taken. In an embodiment, conductor 464 forms a simple line, however, in alternative embodiments, the shape of the conductor can differ. In alternative embodiments of the present invention, the size and shape of cavity 109, as well as the amount and geometrical distribution of magnetic material 108 can differ.

Figure 11A:
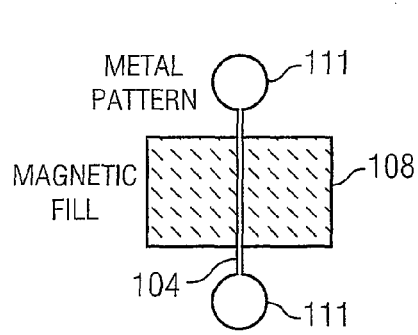
FIGS. 11a-11c illustrate plan view examples of embodiment conductor shapes and magnetic material geometries.
Figure 11B:
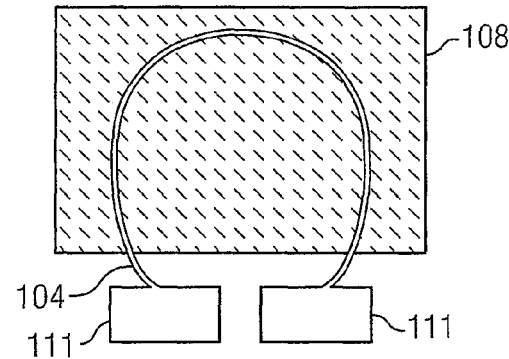
Figure 11C:
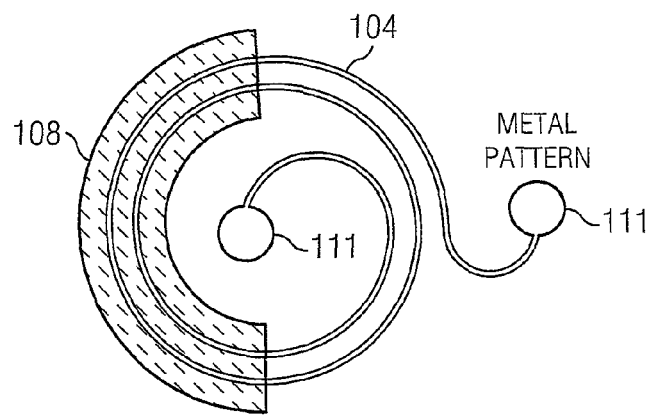

FIGS. 11*a*-11*c* illustrate plan view examples of embodiment conductor shapes and magnetic material geometric distribution. FIG. 11*a* illustrates a plan view of conductor 104 having a simple line shape between terminals 111. Magnetic material 108 is disposed on a portion of conductor 104. FIG. 11*b* illustrates a plan view of conductor 104 having a loop shape between terminals 111. Magnetic material 108 is disposed on the looped portion of conductor 104. FIG. 11*c* illustrates a plan view of conductor 104 having a spiral shape between terminals 111. Magnetic material 108 is disposed on about half of the spiral portion of conductor 104. The geometric shapes of conductor 104 in FIGS. 11*a*-11*c* are non-exclusive examples of possible conductor shapes and magnetic material distribution. In alternative embodiments of the present invention, other conductor shapes and magnetic material distribution geometries can be achieved.

Figure 12:
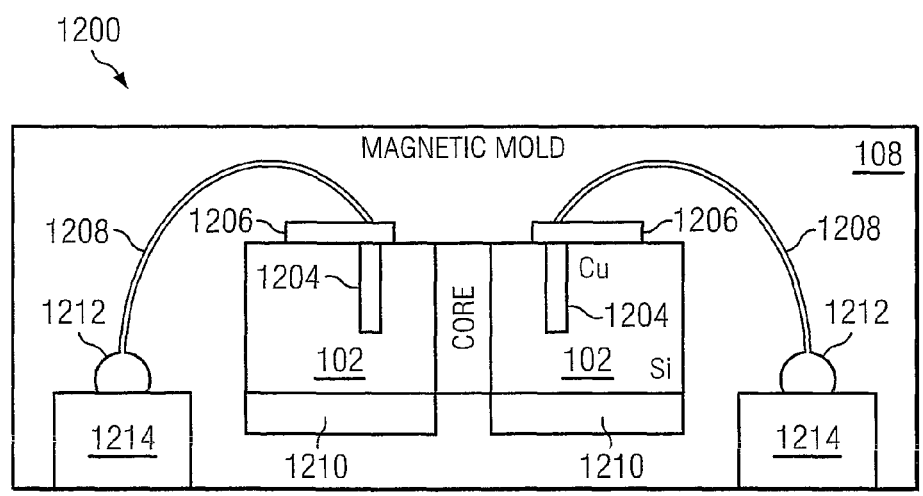
FIG. 12 illustrates a cross-section of a further embodiment inductor including a lead frame.

FIG. 12 illustrates a cross-sectional view of inductor 1200 according to an embodiment of the present invention. Inductor 1200 has substrate 102, in which conductor layer 1204 is deposited. In an embodiment the conductor is isolated from substrate 102 by using an isolation layer (not shown) between them. Connection pads 1206 are situated on top of substrate 102 and are coupled to conductor layer 1204. Bondwires 1208 couple each connection pad 1206 to package pin 1214 via solder balls 1212. Substrate 102 is disposed on leadframe 1210. Magnetic material 108 surrounds substrate 102. In an embodiment, conductive layer 1204 is made of copper and substrate 102 comprises silicon. In alternative embodiments, other materials can be used. In further embodiments, the structure and relationship of substrate 102 and conductor 1204 can conform to other embodiments disclosed herein.

In an embodiment, inductor 1200 is fabricated using existing packaging machinery and processes known in the art, and replacing existing molding compounds used in packaging with magnetic material such as CoZrTa, CoFeHfO, CoAlO, FeSiO, CoFeAlO, CoNbTa, CoZr, and other amorphous cobalt alloys, NiMoFe, NiFe, NiZn or other nickel alloys, FeSiO, FeCuNbSiB or other iron alloys, MnZn or other manganese alloys.

Figure 13A:
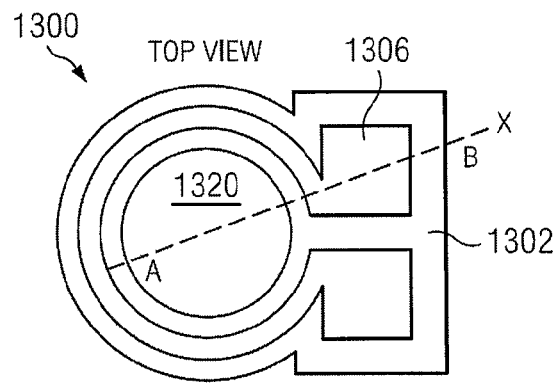
FIGS. 13a and 13b illustrate a plan view and a cross section of another embodiment inductor.
Figure 13B:
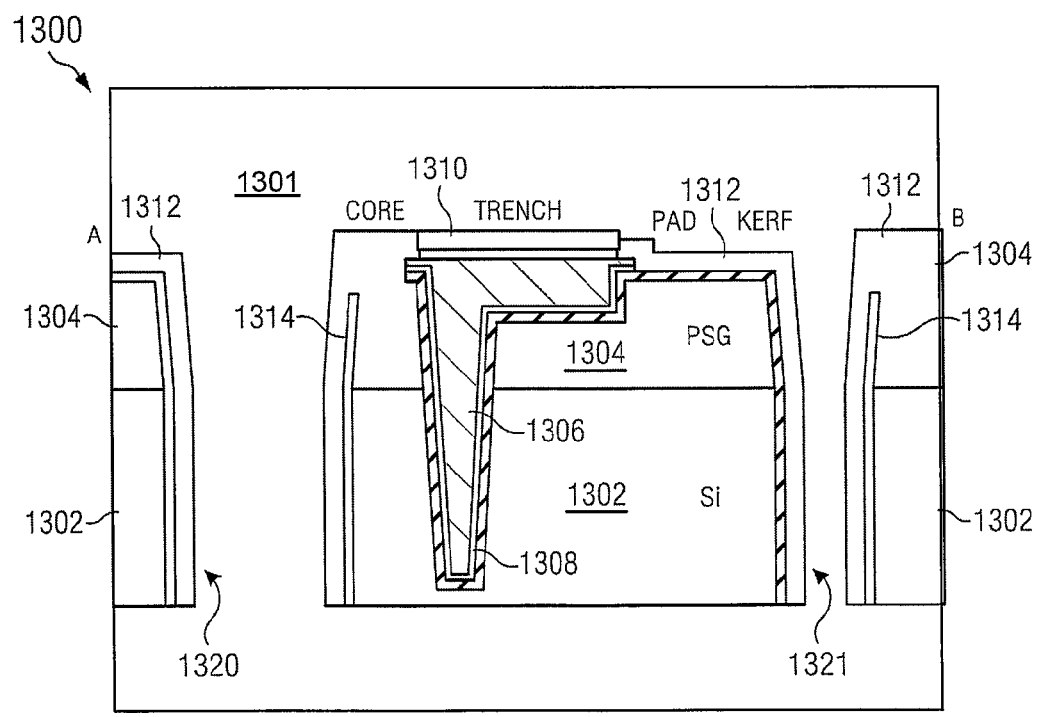

FIGS. 13a and 13b illustrate an embodiment inductor 1300. FIG. 13a illustrates a plan view of inductor 1300 using a though silicon via (TSV) approach. Inductor 1300 comprises conductor 1306 and semiconductor substrate 1302. FIG. 13b illustrates a cross-sectional view of inductor 1300 taken at line x shown in FIG. 13a. Inductor 1300 is fabricated on a semiconductor substrate having an isolator layer disposed on silicon layer 1302. Conductor 1306 is made of copper, which is disposed in a deep trench lined with stack 1308 having an isolator layer and barrier layers against Cu-diffusion into Si. In some embodiments stack 1308 also has an adhesion promoter. Core 1320 and scribe line 1321 is etched from the substrate, which is lined with a passivation layer 1312. Substrate 1302 is surrounded by magnetic material 1301 through core 1320 and scribe line 1321 to form a magnetic loop around conductor 1306.

Using a TSV approach provides low ohmic and low inductance contacts from top to bottom. In an embodiment of the present invention, the TSV is not contacted on the back side of substrate 1302, but is used to provide a vertically integrated copper line. By using a TSV approach, a low cross sectional area and high edge ratio can provide high current capability and low ohmic inductors on a very small area.

Advantages of particular embodiments include having a high cross-sectional area of the magnetic material in the inductor core to avoid magnetic saturation. Such a high cross-sectional area allows for high inductance per unit board space. Furthermore, for embodiments that provide the application of magnetic material in late stage of process after the conductor is formed, the formation of the conductor itself poses no contamination issues with respect to the magnetic material. Furthermore a seamless magnetic material having a low magnetic resistance is achievable in some embodiments that apply the magnetic material in a single step.

Figure 14A:
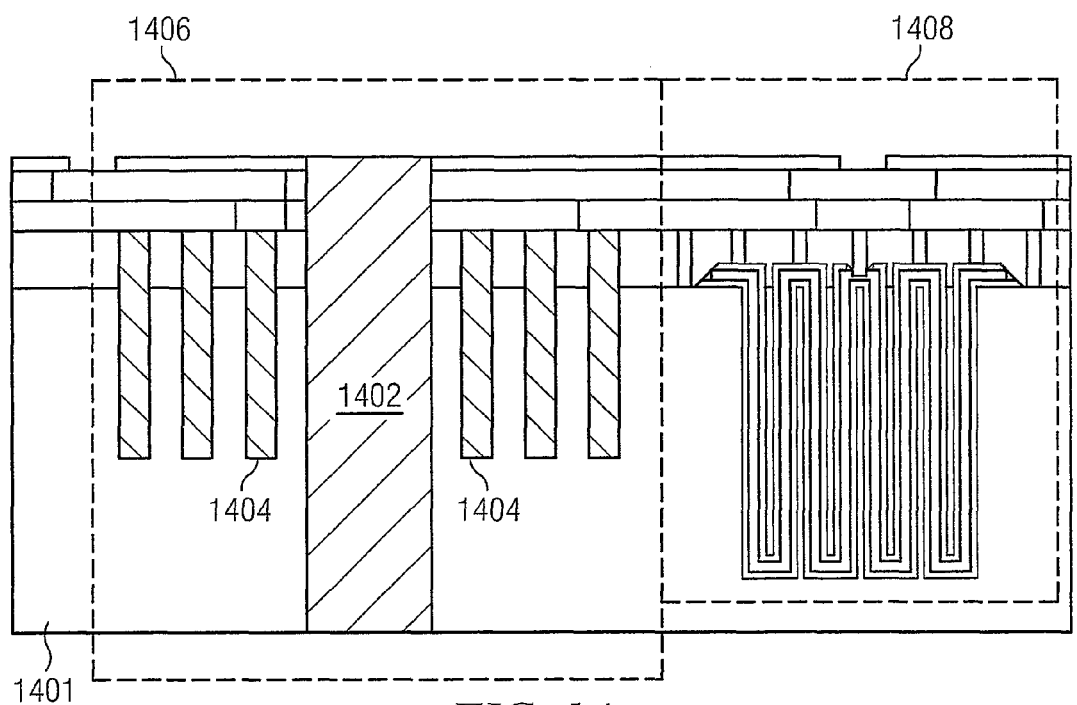
FIGS. 14a and 14b illustrates embodiment having an inductor and other components on the same substrate.
Figure 14B:
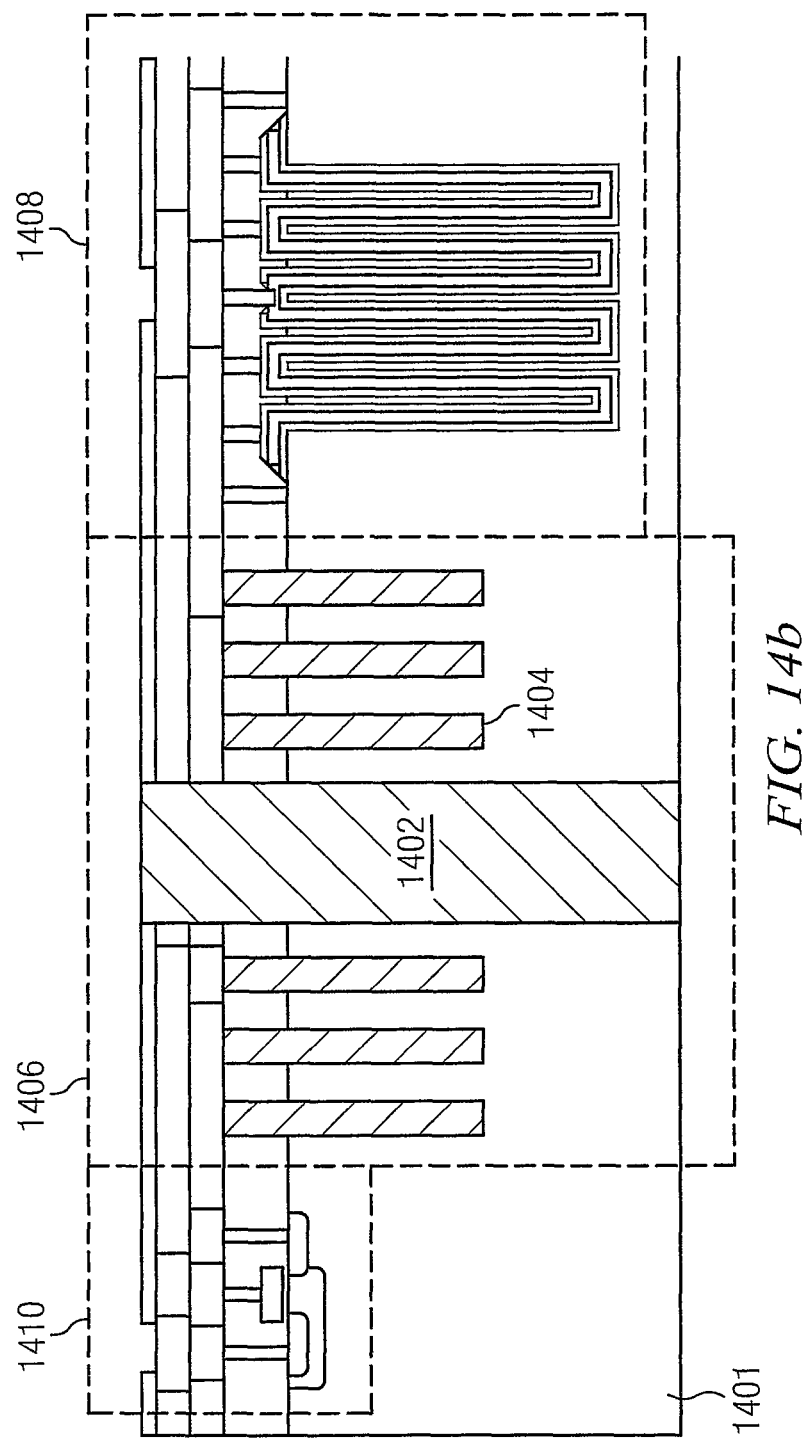

In embodiments of the present invention, inductors can be integrated with other passive components like capacitors, resistors as fabricated by typical semiconductor processes, as well as easy monolithic integration with active devices such as ESD-protection elements, diodes or transistors. For example, FIG. 14a illustrates substrate 1401 on which inductor 1406, having conductor 1404 and core 1402, is disposed. Alongside inductor 1406 on the same substrate is stacked trench capacitor 1408. FIG. 14b illustrates substrate 1401 on which inductor 1406 is disposed alongside stacked trench capacitor 1408 and LDMOS switch 1410. In alternative embodiments, other circuit and elements can be disposed on substrate 1401.

Some embodiments of the present invention provide higher inductance values at low series resistance compared to conventional chip inductors. Furthermore, some embodiments, fabrication is more cost effective due to the use of parallel process of many devices on one substrate. Embodiments also offer easy and cost effective application of magnetic material even in complicated geometries by using fill process, such as printing, injection or other methods.

In embodiments, dual use of mold material is possible. For example using magnetic material in a packaging process offers standard protection and handling support as well as providing for a closed magnetic loop. For compact and an inexpensive integration, many wafer level packing (WLP) and system in a package (SiP) assembly techniques are available for embodiments of the present invention. In some embodiments, no patterning of magnetic material is necessary because geometry is given by before formed cavities.

In embodiments of the present invention that do not require a baking step for the magnetic material, the process is compatible with many integrated circuit processes because the substrate is not exposed to high temperatures.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. An inductor comprising:
a substrate;
a conductor disposed above the substrate; and
a seamless ferromagnetic material surrounding at least a first portion of the conductor,
wherein the substrate surrounds a gap extending from a top surface of the substrate through a bottom surface of the substrate, and the seamless ferromagnetic material fills the gap.

2. The inductor of claim 1, wherein at least a second portion of the conductor touches the substrate.

3. The inductor of claim 1, wherein the conductor comprises a loop.

4. The inductor of claim 1, further comprising a pad electrically coupled to the conductor.

5. The inductor of claim 1, wherein the substrate is disposed on a leadframe.

6. The inductor of claim 5, further comprising a bondwire coupled between a pad on the leadframe and a pad coupled to the conductor.

7. The inductor of claim 1, wherein the conductor has a cross-section comprising a first portion suspended above the substrate and a second portion suspended above the first portion.

8. The inductor of claim 1, wherein the substrate comprises a depressed portion beneath at least a second portion of the conductor, the depressed portion comprising a bottom surface a first distance below a top surface of the substrate.

9. The inductor of claim 1, further comprising a supporting layer disposed below at least a second portion of the conductor.

10. The inductor of claim 1, further comprising a circuit disposed on the substrate.

11. The inductor of claim 10, wherein the circuit is coupled to the conductor.

12. The inductor of claim 1, wherein the conductor comprises a plurality of windings.

13. An inductor comprising:
a semiconductor substrate;
a conductor disposed within a trench in the semiconductor substrate; and
a seamless ferromagnetic material surrounding at least a first portion of the conductor,
wherein the substrate surrounds a first gap extending from a top surface of the semiconductor substrate through a bottom surface of the substrate, and the seamless ferromagnetic material fills the first gap.

14. The inductor of claim 13, wherein the trench comprises a deep trench.

15. The inductor of claim 13, wherein the first gap is disposed adjacent to a first side of a first portion of the conductor.

16. The inductor of claim 15, wherein the first portion of the conductor forms a loop, and wherein the first gap is disposed within a center portion of the loop.

17. The inductor of claim 15, further comprising an edge of the semiconductor substrate disposed on a second side of the first portion of the conductor.

18. The inductor of claim 17, wherein the edge of the semiconductor substrate is formed by a scribe line.

19. The inductor of claim 15, wherein the seamless magnetic ferromagnetic fills the gap.

20. The inductor of claim 13, wherein the conductor disposed within the trench is a through silicon via (TSV).

21. The inductor of claim 17, wherein the conductor comprises copper.

22. The inductor of claim 13, further comprising an isolator layer disposed on the semiconductor substrate.

23. The inductor of claim 15, further comprising conductive pad coupled to conductor.

24. The inductor of claim 15, further comprising a lead frame coupled to the conductor.

25. An circuit component comprising:
a semiconductor substrate;
a conductor disposed within a trench in a semiconductor substrate, the conductor comprising a first portion forming at least one loop;
a gap disposed within the semiconductor substrate within the at least one loop, the gap spanning from a top surface of the semiconductor substrate to a bottom surface of the semiconductor substrate; and
a seamless ferromagnetic material filling the gap and surrounding at least the first portion of the conductor.

26. The circuit component of claim 25, wherein a first portion of the conductor forming at least one loop comprises an inductor.

27. The circuit component of claim 25, further comprising an outer edge of the semiconductor substrate disposed immediately adjacent to the first portion of the conductor outside the at least one loop.

28. The circuit component of claim 27, wherein the outer edge of the semiconductor substrate is formed by a scribe line.

29. The circuit component of claim 27, wherein first portion of the conductor is formed by a through silicon via (TSV).

* * * * *